(12) United States Patent
Lee et al.

(10) Patent No.: US 8,866,373 B2
(45) Date of Patent: Oct. 21, 2014

(54) LIGHT EMITTING DEVICE AND DISPLAY DEVICE HAVING THE SAME

(75) Inventors: Dong Chin Lee, Cheonan-si (KR);
Gicherl Kim, Asan-si (KR);
Byungchoon Yang, Seoul (KR);
Young-keun Lee, Cheonan-si (KR);
Seung Hwan Baek, Seoul (KR); So jin Ryu, Seoul (KR)

(73) Assignee: Samsung Display Co., Ltd. (KR)

( * ) Notice: Subject to any disclaimer, the term of this patent is extended or adjusted under 35 U.S.C. 154(b) by 1016 days.

(21) Appl. No.: 12/857,739

(22) Filed: Aug. 17, 2010

(65) Prior Publication Data
US 2011/0157916 A1   Jun. 30, 2011

(30) Foreign Application Priority Data

Dec. 29, 2009   (KR) .......................... 10-2009-0133154

(51) Int. Cl.
*F21V 7/22* (2006.01)
*F21V 9/00* (2006.01)
*G02F 1/1335* (2006.01)
*C09K 11/77* (2006.01)
*H01L 33/50* (2010.01)

(52) U.S. Cl.
CPC ........... *C09K 11/7734* (2013.01); *Y02B 20/181* (2013.01); *G02F 1/1336* (2013.01); *G02F 2001/133614* (2013.01); *G02F 1/133603* (2013.01); *H01L 33/504* (2013.01)
USPC .......................................... 313/501; 313/498

(58) Field of Classification Search
CPC ................... H01L 33/504; G02F 2001/133614
USPC ..................................................... 313/503, 501
See application file for complete search history.

(56) References Cited

FOREIGN PATENT DOCUMENTS

| EP | 1367655 A1 | 12/2003 |
|---|---|---|
| EP | 0936682 B9 | 8/2007 |
| JP | 2007109616 A | 4/2007 |
| JP | 2008-218998 A | 9/2008 |
| JP | 2008-235552 A | 10/2008 |
| KR | 1020060034056 A | 4/2006 |
| WO | 2009028657 A1 | 3/2009 |

OTHER PUBLICATIONS

JP2008-235552 machine translation.*
Machine Translatioin of JP2008218998.*

* cited by examiner

*Primary Examiner* — Nimeshkumar Patel
*Assistant Examiner* — Jacob R Stern
(74) *Attorney, Agent, or Firm* — Cantor Colburn LLP (57) ABSTRACT

A display device includes a display panel and a light emitting device to supply light to the display panel. The light emitting device includes a light emitting element emitting a first light and a fluorescent layer receiving the first light, transmitting a portion of the first light, converting a remaining portion of the first light to a second light having a wavelength range different from the first light, and emitting the second light. The second light emitted by the fluorescent layer has a full width at half maximum equal to or larger than 110 nanometers (nm) and a light emission spectrum having a peak wavelength within a wavelength range of about 530 nm to about 560 nm. The second light has a light emission intensity corresponding to 10 to 30 percent of a peak light emission intensity of the first light.

19 Claims, 9 Drawing Sheets

LIGHT EMITTING DEVICE AND DISPLAY DEVICE HAVING THE SAME

This application claims priority to Korean Patent Application No. 2009-0133154 filed on Dec. 29, 2009, and all the benefits accruing therefrom under 35 U.S.C. §119, the contents of which are herein incorporated by reference in its entirety.

BACKGROUND OF THE INVENTION

1. Field of the Invention

The invention relates to a light emitting device and a display device having the same. More particularly, the invention relates to a light emitting device capable of improving light emitting efficiency and a display device having the light emitting device.

2. Description of the Related Art

As a method of realizing a white light emitting diode, a multi-chip scheme and a fluorescent substance application scheme have been widely used.

In the multi-chip scheme, the white light emitting diode includes a red light emitting chip, a green light emitting chip, and a blue light emitting chip, and a white light is generated by mixing lights of different colors generated from the red, green, and blue light emitting chips. However, the color coordinate of the white light is changed since the light intensity of the lights from the red, green, and blue light emitting chips is varied according to the unstable operation voltage and the ambient temperature.

In the fluorescent substance application scheme, the white light emitting diode includes a blue light emitting chip outputting blue light and a fluorescent substance excited by the blue light to emit yellow light, and the white light is generated by mixing the blue light and the yellow light.

BRIEF SUMMARY OF THE INVENTION

Embodiments of the invention provide a light emitting device capable of improving light emitting efficiency.

Embodiments of the invention provide a display device including the light emitting device.

According to an exemplary embodiment, a display device includes a display panel including a plurality of pixels and a light emitting device mixing a first light with a second light to emit a third light to the display panel. The light emitting device includes a light emitting element that emits the first light and a fluorescent layer that receives the first light, transmits a portion of the first light, converts a remaining portion of the first light to the second light and emits the third light. The second light has a full width at half maximum equal to or larger than 110 nanometers (nm) and a light emission spectrum having a peak wavelength within a wavelength range of about 530 nm to about 560 nm. The second light has a light emission intensity corresponding to approximately 10% to 30% of a peak light emission intensity of the first light within a predetermined wavelength range.

According to another exemplary embodiment, a light emitting device includes a light emitting element that emits a first light and a fluorescent layer that receives the first light, transmits a portion of the first light, converts a remaining portion of the first light to a second light having a wavelength range different from the first light, and mixes the first light with the second light to emit a third light. The fluorescent layer has a full width at half maximum equal to or larger than 110 nm and a light emission spectrum having a peak wavelength within a wavelength range of about 530 nm to about 560 nm. The light emission spectrum of the fluorescent layer includes a green wavelength region and a red wavelength region, and an area ratio of the green wavelength region to the red wavelength region is in the range of about 10:3 to about 7:1.

According to the exemplary embodiments, the display device employs a light emitting diode, to which the fluorescent substance emitting the light having the peak wavelength corresponding to a high transmittance wavelength region is applied, as its light source, thereby improving brightness thereof. In addition, the light efficiency of the light emitting device may be improved, to thereby reduce the number of the light emitting diodes and the manufacturing cost.

In addition, the light emitting device emits the light having a full width at half maximum equal to or larger than 110 nm, thus the light efficiency of the light emitting device and the brightness of the display panel may be improved.

BRIEF DESCRIPTION OF THE DRAWINGS

The above and other advantages of the invention will become readily apparent by reference to the following detailed description when considered in conjunction with the accompanying drawings wherein.

DETAILED DESCRIPTION OF THE INVENTION

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on" or "connected to" another element or layer, it can be directly on or connected to the other element or layer or intervening elements or layers may be present. In contrast, when an element is referred to as being "directly on" or "directly connected to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the invention.

Spatially relative terms, such as "lower", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a," "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Hereinafter, the invention will be explained in detail with reference to the accompanying drawings.

Figure 1:
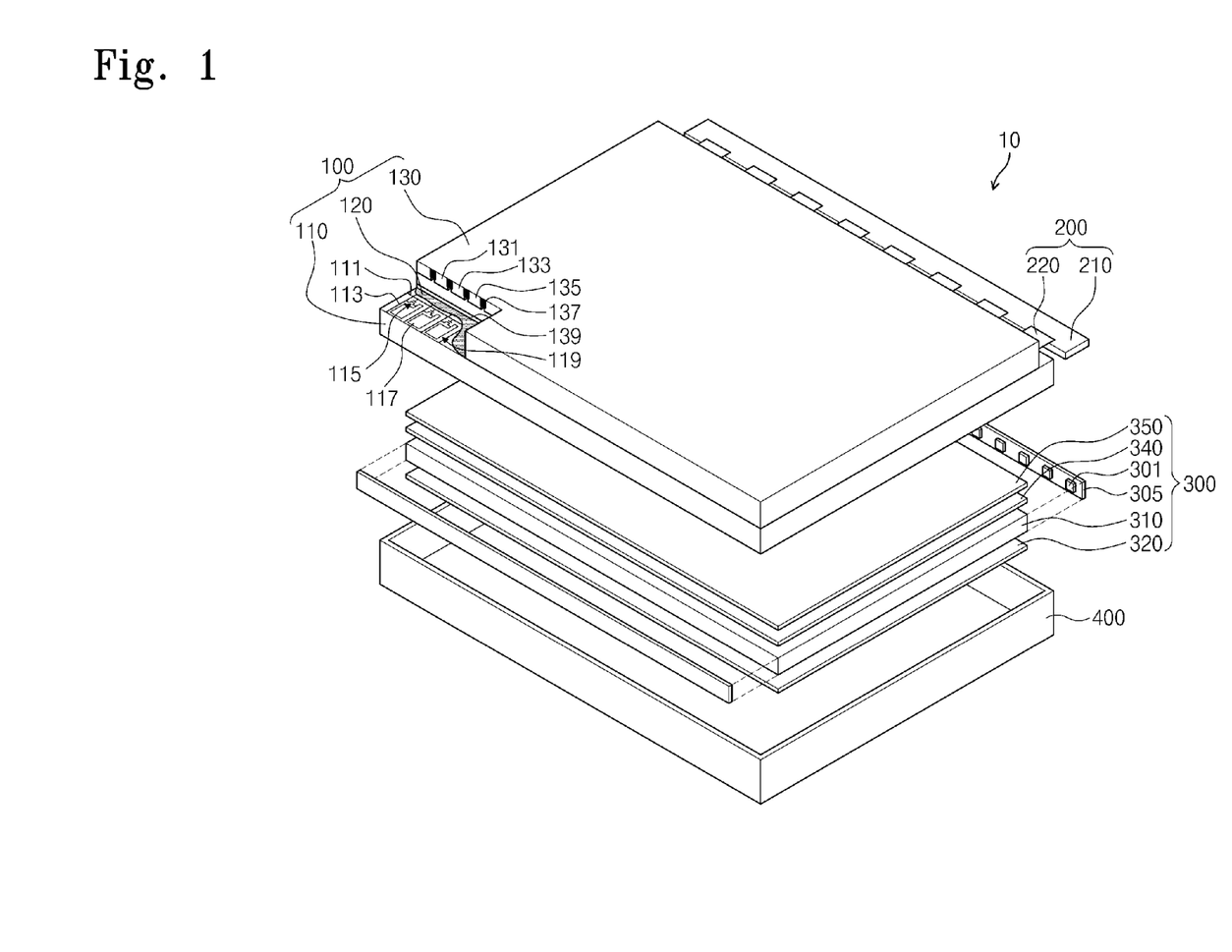
FIG. 1 is an exploded perspective view showing an exemplary embodiment of a display device, according to the invention.

FIG. 1 is an exploded perspective view showing an exemplary embodiment of a display device, according to the invention.

Referring to FIG. 1, a display device 10 includes a display panel 100, a driving circuit 200, a backlight unit 300, and a chassis 400.

The display panel 100 receives a light to display images. The display panel 100 includes a lower substrate 110, an upper substrate 130 facing the lower substrate 110, and a liquid crystal layer 120 interposed between the lower substrate 110 and the upper substrate 130 to control a transmitting amount of the light therethrough.

The lower substrate 110 includes a first base substrate, a plurality of gate lines 111, a plurality of data lines 113, and a plurality of pixels 119. The first base substrate of the lower substrate 110 may be glass or other material, such as plastic. The gate lines 111 are extended in a first direction on the first base substrate, and arranged in a second direction substantially perpendicular to the first direction. The data lines 113 are extended in the second direction. Each of the pixels 119 includes a thin film transistor 115 and a pixel electrode 117. The thin film transistor 115 is physically and/or electrically connected to a corresponding gate line 111 among the gate lines 111, and a corresponding data line 113 among the data lines 113. The pixel electrode 117 is physically and/or electrically connected to the thin film transistor 115.

The upper substrate 130 includes a second base substrate, and a plurality of color filters 131, 133, and 135 arranged corresponding to the pixels 119, respectively. The second base substrate of the upper substrate 130 may be glass or plastic, and the color filters 131, 133, and 135 include a red color filter 131, a green color filter 133, and a blue color filter 135. In addition, the upper substrate 130 includes a black matrix 137 disposed between two adjacent color filters of the red, green, and blue color filters 131, 133, and 135, and a common electrode 139 that forms an electric field with the pixel electrode 117 to operate the liquid crystal molecules of the liquid crystal layer 120.

The driving circuit 200 includes a gate driver (not shown), a data driver (not shown), a controller (not shown), and a circuit substrate 210 in order to supply various driving signals. The controller is mounted on the circuit substrate 210 and physically and/or electrically connected to the lower substrate 110 through a plurality of connection films 220. The gate driver may be directly disposed on the lower substrate 110 or may be in a chip form to be mounted on the connection films 220 or the lower substrate 110. The data driver may be mounted on the connection films 220 or the lower substrate 110.

The backlight unit 300 includes a plurality of light emitting devices 301, a light source substrate 305, a light guide plate 310, a reflection sheet 320, a diffusion sheet 340, and a prism sheet 350.

The light emitting devices 301 are mounted on the light source substrate 305 while being spaced apart from each other, and each of the light emitting devices 301 includes a white light emitting diode that emits a white light. The light emitting devices 301 receive a driving power source through the light source substrate 305 connected to an external power source unit. The light emitting devices 301 may be arranged adjacent to at least one side of four sides of the light guide plate 310. As illustrated in FIG. 1, the light source substrate 305 including light emitting devices 301 disposed thereon, may be disposed on opposing sides of the light guide plate 310, but the invention is not limited thereto.

The light guide plate 310 may include of a transparent material to refract light. The light guide plate 310 receives the light emitted from the light emitting devices 301 through an incident surface thereof adjacent to the light emitting devices 301, and changes a traveling direction of the light to provide the display panel 100 at a front side of the display device 10 with the light.

The reflection sheet 320 includes a light reflection layer disposed on a base sheet and is disposed under the light guide plate 310. The reflection sheet 320 reflects the light leaking from the light guide plate 310 to reduce a light loss of the light guide plate 310.

The diffusion sheet 340 is disposed on the light guide plate 310 to receive the light exiting from an exiting surface of the light guide plate 310. The diffusion sheet 340 diffuses the light from the light guide plate 310 such that the diffused light is uniformly provided to the display panel 100.

The prism sheet 350 is disposed on a front side of the diffusion sheet 340 and receives the light from the diffusion sheet 340. The prism sheet 350 condenses the light diffused by the diffusion sheet 340 to allow the light to travel in a direction vertical to the display panel 100.

The chassis 400 receives the display panel 100 and the backlight unit 300 therein, and protects display panel 100 and the backlight unit 300 from external impacts.

The light emitting devices 301 may emit lights having intensities different from one another according to their positions and the ambient temperature. If the display device 10 is installed in a vertical fashion to the ground and the light emitting devices 301 are arranged in a direction vertical to the ground, the light emitting devices 301 emit the light having the intensities different from one another according to their height from the ground. As a result, the brightness of the display device 10 is varied along the vertical direction. Therefore, the light emitting devices 301 according to the illustrated exemplary embodiment may be installed adjacent to one or two sides of the light guide plate 310, which is substantially horizontal to the ground, so that the brightness of the display device 10 does not vary along the height from the ground. In FIG. 1, an edge-illumination type backlight unit 300, where the light emitting devices 301 are disposed adjacent to the side of the light guide plate 310 has been shown, but it should not be limited thereto. That is, the light emitting devices 301 may be disposed under the display panel 100, such as in a direct-illumination type backlight unit.

Figure 2:
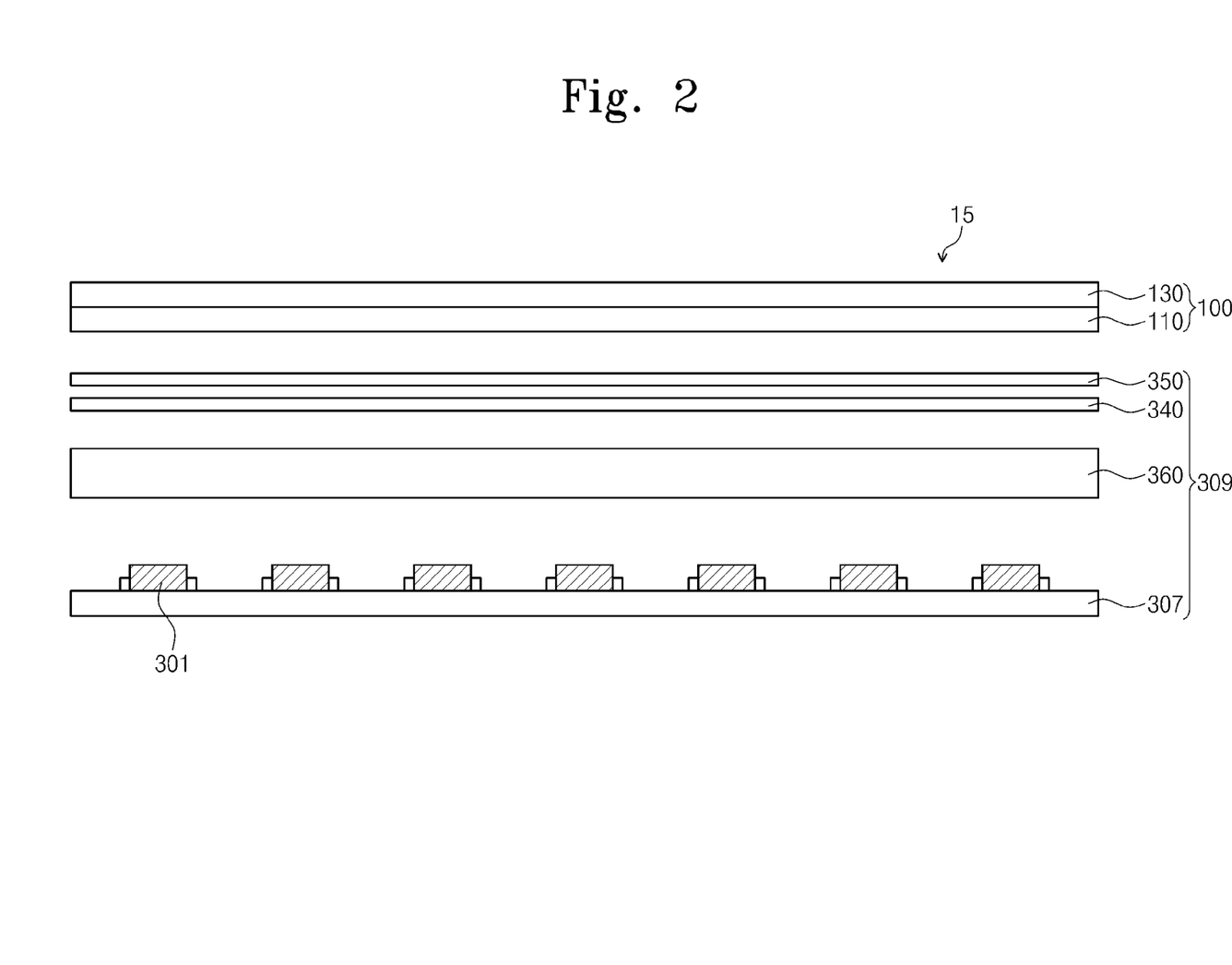
FIG. 2 is a cross-sectional view showing another exemplary embodiment of a display device, according to the invention.

FIG. 2 is a cross-sectional view showing another exemplary embodiment of a display device, according to the invention. In FIG. 2, the same reference numerals denote the same elements in FIG. 1, and thus detailed descriptions of the same elements will be omitted.

Referring to FIG. 2, a display device 15 includes a direct-illumination type backlight unit 309 disposed under a display panel 100.

The direct-illumination type backlight unit 309 includes a circuit substrate 307 disposed under the display panel 100 and a plurality of light emitting devices 301 mounted on the circuit substrate 307 to emit light. The light emitting devices 301 are mounted on the circuit substrate 307 while being spaced apart from each other, and each of the light emitting devices 301 includes a white light emitting diode that emits a white light.

As shown in FIG. 2, a diffusion plate 360, a diffusing sheet 340, and a prism sheet 350 are disposed between the display panel 100 and the light emitting devices 301. The diffusion plate 360 receives the light from the light emitting devices 301 and uniformly diffuses the light.

Hereinafter, the light emitting devices shown in FIGS. 1 and 2 will be described. In particular, the light emitting devices will be described as a representative exemplary embodiment since the light emitting devices shown in FIG. 2 have the same structure and function as the light emitting devices shown in FIG. 1.

Figure 3:
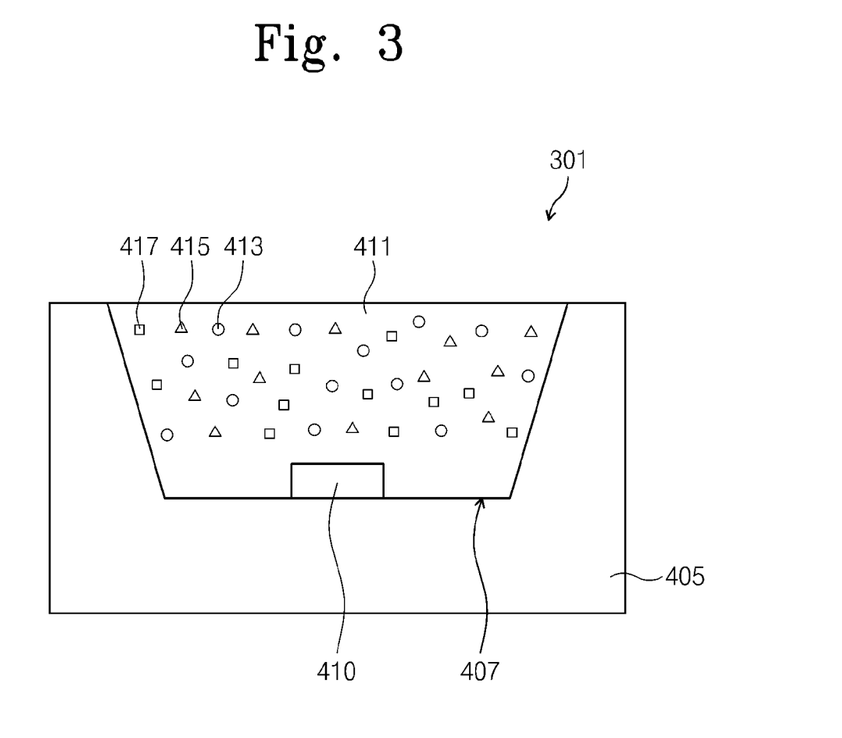
FIG. 3 is a cross-sectional view showing an exemplary embodiment of a light emitting device, according to the invention.

FIG. 3 is a cross-sectional view showing an exemplary embodiment of a light emitting device, according to the invention.

Referring to FIG. 3, the light emitting device 301 includes a frame 405 provided with a receiving portion 407, a light emitting element 410 received in the receiving portion 407 to emit a blue light, and a fluorescent layer 411 receiving the blue light emitted from the light emitting unit 410. The fluorescent layer 411 transmits a portion of the blue light and converts the remaining portion of the blue light into a yellow light.

The frame 405 includes the receiving portion 407 that provides a receiving space in which the light emitting unit 410 is disposed. The receiving portion 407 includes a substantially planar bottom surface, and an inclined wall that inclines toward the bottom surface. The frame 405 may further include a light reflection layer (not shown) disposed on the inclined surface of the receiving portion 407 and a power supply member (not shown) disposed on the bottom surface to supply a power to the light emitting unit 410.

The light emitting unit 410 is disposed directly on the bottom surface of the receiving portion 407 and emits the blue light in response to the power supplied to the light emitting unit 410. The blue light has a light emission spectrum having a peak wavelength within a wavelength range of about 435 nanometers (nm) to about 460 nanometers (nm). In one exemplary embodiment, the light emitting unit 410 may be a semiconductor chip, e.g., a compound semiconductor chip including an indium gallium nitride (InGaN)-based semiconductor layer, a gallium nitride (GaN)-based semiconductor layer, or an aluminum gallium nitride (AlGaN)-based semiconductor layer.

The fluorescent layer 411 is disposed directly on and contacting the light emitting unit 410, and includes a polymer material filling the receiving portion 407 to surround the light emitting unit 410, such as surrounding and contacting all surfaces of the light emitting unit 410 not disposed contacting the bottom surface of the receiving portion 407. The fluorescent layer 411 transmits a portion of the blue light emitted from the light emitting unit 410, and converts a remaining portion of the blue light into a yellow light.

In order to emit the yellow light, the fluorescent layer 411 may include at least one fluorescent substance. The fluorescent substance has a chemical formula of $(Ba_{1-x-y-z}Sr_xCa_y)_2SiO_4:Eu_z$ ($0 \leq x \leq 1$, $0 \leq y \leq 1$, $0 \leq y \leq 1$, and $0 \leq 1-x-y-z$). In one exemplary embodiment, the fluorescent substance may include a silicate (SiOx)-based material including at least one of barium (Ba), strontium (Sr), and Calcium (Ca).

As in the illustrated exemplary embodiment, the fluorescent layer 411 may collectively include a first fluorescent substance 413, a second fluorescent substance 415, and a third fluorescent substance 417. Each of the first, second, and third fluorescent substances 413, 415 and 417 have a peak wavelength within different wavelength ranges. The first fluorescent substance 413 includes a silicate-based fluorescent substance including barium, and has a chemical formula of $Ba_2SiO_4:Eu$. The second fluorescent substance 415 includes a silicate-based fluorescent substance including barium and strontium, and has a chemical formula of $(Ba_{1-x}Sr_x)_2SiO_4:Eu$ ($0 \leq x \leq 1$). The third fluorescent substance 417 includes a silicate-based fluorescent substance including strontium and calcium, and has a chemical formula of $(Sr_{1-x}Ca_x)_2SiO_4:Eu$ (0≤x≤1).

Alternatively, the fluorescent layer 411 may further include a fourth silicate-based fluorescent substance including strontium, and having a chemical formula of $Sr_2SiO_4:Eu$. In addition, the fourth fluorescent substance may be included in the fluorescent layer 411 instead of one of the first, second, and third fluorescent substances 413, 415, and 417. The light emission spectrum of the first, second, and third fluorescent substances 413, 415, and 417 will be described with reference to FIG. 5.

The light emitting devices 301 emits the white light by mixing the blue light passed through the fluorescent layer 411 and the yellow light converted by the fluorescent layer 411. The yellow light has a light emission spectrum having a peak wavelength within a transmission wavelength range (e.g., about 530 nm to about 560 nm) corresponding to the green color filter 133 of the display panel 100.

Figure 4:
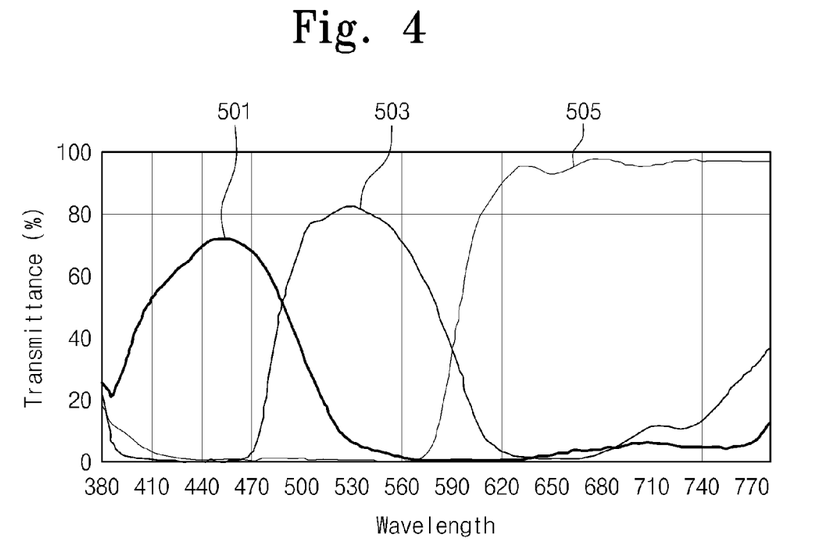
FIG. 4 is a graph showing a transmittance of a white light transmitted through a color filter of a display panel after being emitted from an exemplary embodiment of a light emitting device.

FIG. 4 is a graph showing a transmittance of a white light transmitted through a color filter of a display panel after being emitted from an exemplary embodiment of a light emitting device. In FIG. 4, a horizontal axis represents a wavelength (nm) and a vertical axis represents a transmittance (%). In addition, in FIG. 4, a first graph 501 represents a transmittance in accordance with the wavelength of the white light passing through the blue color filter 135 of the display panel 100, a second graph 503 represents a transmittance in accordance with the wavelength of the white light passing through the green color filter 133 of the display panel 100, and a third graph 505 represents a transmittance in accordance with the wavelength of the white light passing through the red color filter 131 of the display panel 100.

For the convenience of explanation, a main wavelength range of the first graph 501, a main wavelength range of the second graph 503, and a main wavelength range of the third graph 505 will be referred to as a blue color wavelength range, a green color wavelength range, and a red color wavelength range, respectively. In the illustrated exemplary embodiment, the blue color wavelength range is within a range of about 410 nm to about 490 nm, the green color wavelength range is within a range of about 490 nm to about 590 nm, and the red color wavelength range is within a range of about 590 nm to about 680 nm.

Figure 5:
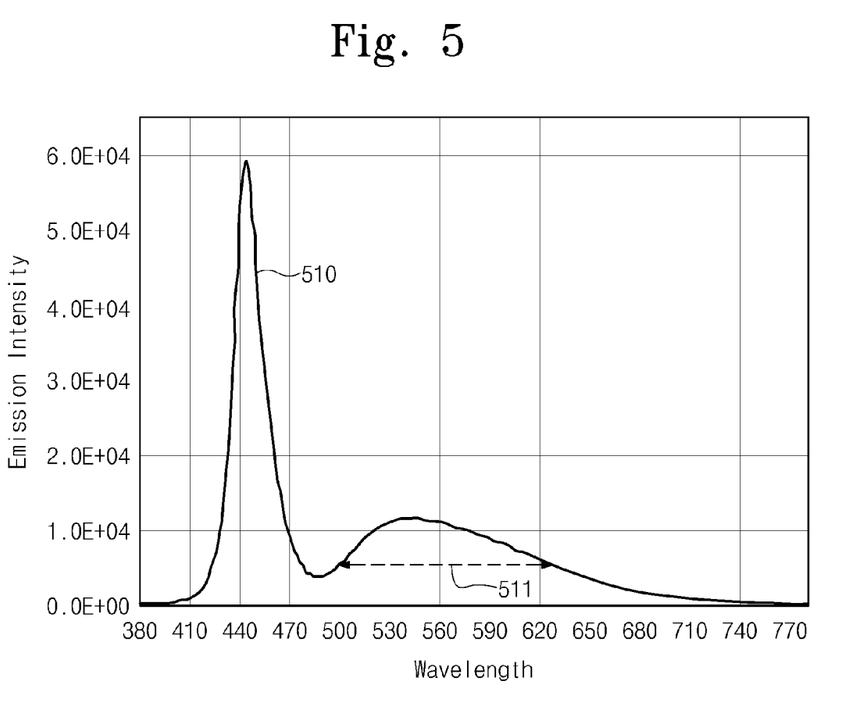
FIG. 5 is a graph showing a light emission spectrum of a white light emitted from an exemplary embodiment of a light emitting device, according to the invention.

FIG. 5 is a graph showing a light emission spectrum of a white light emitted from an exemplary embodiment of a light emitting device, according to the invention. In FIG. 5, a horizontal axis represents a wavelength (nm) and a vertical axis represents an emission intensity.

The white light emitted from the light emitting devices 301 has the light emission spectrum represented by the fourth graph 510 shown in FIG. 5. The white light is obtained by mixing the blue light in the blue color wavelength range, with the yellow light included in a portion of the green color wavelength range, and a portion of the red color wavelength range. Thus, the yellow light may transmit through the red and green color filters 131 and 133 in the display panel 100. The green color filter 133 has a light transmittance higher than that of the red color filter 131. Accordingly, the peak wavelength of the yellow light is in the green color wavelength range in order to improve the entire brightness of the display panel 100. In one exemplary embodiment, the peak wavelength of the yellow light is in the wavelength range of about 530 nm to about 560 nm of the green color wavelength range.

Therefore, the white light generated by mixing the blue light and the yellow light has two peak wavelengths, and the peak wavelength of the blue light among the two peak wavelengths exists in the blue color wavelength range and the peak wavelength of the yellow light among the two peak wavelengths exists in the green color wavelength range. In particular, the peak wavelength of the blue light exists in the range of about 440 nm to about 460 nm, and the peak wavelength of the yellow light exists in the range of about 530 nm to about 560 nm.

Referring to FIG. 5, the yellow light has a full width at half maximum ("FWHM") 511 equal to or larger than about 110 nm. If the FWHM 511 is set to 110 nm, the white light may have color reproducibility equal to or greater than 72% in comparison with a national television system committee ("NTSC") standard for the display device.

In the light emission spectrum of the white light shown in FIG. 5, the wavelength range (hereinafter, referred to as yellow color wavelength range) of the yellow light may be in the range of about 500 nm to about 620 nm. In addition, in FIG. 5, the yellow light in the yellow color wavelength range of about 500 nm to about 620 nm has the light emission intensity corresponding to approximately 10%~30% of the peak light emission intensity of the blue light.

Referring to FIG. 5, the peak light emission intensity of the blue light has been observed at 5.9 E+04 in the wavelength of about 450 nm of the fourth graph 510, and the peak light emission intensity of the yellow light has been observed at 1.18 E+04 in the wavelength of about 540 nm of the fourth graph 510. In this case, the yellow light has the peak light emission intensity corresponding to approximately 20% of the peak light emission intensity of the blue light.

In addition, the peak light emission intensity of the yellow light has been observed at 1.1 E+04 in the wavelength of about 560 nm. Thus, the yellow light has the light emission intensity corresponding to approximately 18.6% of the peak light emission intensity of the blue light in the wavelength of about 560 nm.

As another exemplary embodiment, the light emission intensity of the yellow light has been observed at 0.83 E+04 in the wavelength of about 595 nm and at 0.69 E+04 in the wavelength of about 610 nm. Consequently, the yellow light has the light emission intensity corresponding to approximately 14.2% of the peak light emission intensity of the blue light at about 595 nm of the fourth graph 510, and the light emission intensity corresponding to approximately 11.7% of the peak light emission intensity of the blue light at about 610 nm of the fourth graph 510.

If the yellow light has the light emission intensity smaller than 10% of the peak light emission intensity of the blue light, or greater than 30% of the peak light emission intensity of the blue light in the yellow color wavelength range of about 500 nm to about 620 nm, the white light may be deviated from a color coordinate diagram appropriate to the displayed images of the display panel 100 with reference to CIE 1931 color coordinate diagram. In one exemplary embodiment, when the light emission intensity of the yellow light is in a range of about 10% to about 30% of the peak light emission intensity of the blue light, the white light has an x-axis coordinate of about 0.24 to about 0.26 and a y-axis coordinate of about 0.20 to about 0.21 with reference to CIE 1931 color coordinate diagram. In this case, the white light has a color temperature of about 100,000 Kelvin (K).

According to the light emitting devices 301, since the peak wavelength of the yellow light emitted from the fluorescent layer 411 exists in the green color wavelength range, the brightness of the light applied to the display panel 100 becomes high. In addition, the white light emitted from the light emitting devices 301 may have color coordinates appropriate for the display image of the display panel 100 by controlling the light emission intensity and the FWHM of the yellow light.

Hereinafter, the yellow light emitted from the fluorescent layer 411 of the light emitting devices 301 will be described in detail with reference to FIG. 6.

Figure 6:
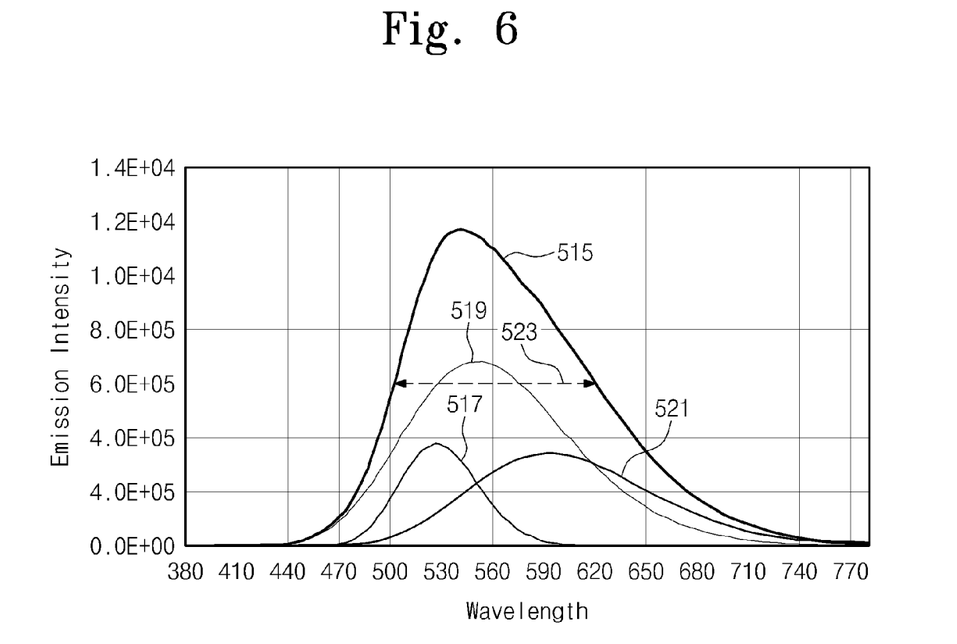
FIG. 6 is a graph showing a light emission spectrum of a yellow light emitted from a fluorescent layer, according to an exemplary embodiment of the invention.

FIG. 6 is a graph showing a light emission spectrum of a yellow light emitted from a fluorescent layer, according to an exemplary embodiment of the invention. In FIG. 6, the fluorescent layer 411 includes the first, second, and third fluorescent substances 413, 415, and 417.

Each of the first, second, and third fluorescent substances 413, 415, and 417 includes the silicate-based fluorescent substance including at least one of barium, strontium, and calcium. The yellow light emitted from the fluorescent layer 411 has the light emission spectrum indicated by a fifth graph 515 in FIG. 6. According to the fifth graph 515, the peak wavelength of the yellow light exists in the wavelength range of about 530 nm to about 560 nm, and the yellow light has the FWHM 523 equal to or greater than 110 nm. Thus, the brightness of the display device 10 may be improved and the display device 10 may have color reproducibility of about 72% in comparison with a national television system committee ("NTSC") standard for the display device.

The light emission spectrum of the yellow light may be determined by a weight ratio of the first, second, and third fluorescent substances 413, 415, and 417. The light emission spectrum of the first fluorescent substance 413 is indicated by a sixth graph 517, the light emission spectrum of the second fluorescent substance 415 is indicated by a seventh graph 519, and the light emission spectrum of the third fluorescent substance 417 is indicated by an eighth graph 521.

In one exemplary embodiment, the first fluorescent substance 413 has about 20 parts by weight or less, the second fluorescent substance 415 has about 35 to about 60 parts by weight, and the third fluorescent substance has about 20 to about 65 parts by weight.

Referring to FIG. 6, the peak wavelength of the first fluorescent substance 413 exists in the wavelength range of about 515 nm to about 530 nm, and the light emission spectrum 517 of the first fluorescent substance 413 has an area smaller than 20 percent of the light emission spectrum 515 of the fluorescent layer 411. The peak wavelength of the second fluorescent substance 415 exists in the wavelength range of about 540 nm to about 560 nm and the light emission spectrum 519 of the second fluorescent substance 415 has an area of about 35 percent to about 60 percent with respect to the light emission spectrum 515 of the fluorescent layer 411. The peak wavelength of the third fluorescent substance 417 exists in the wavelength of about 580 nm to about 610 nm and the light emission spectrum 521 of the third fluorescent substance 417 has an area of about 20 percent to about 65 percent with respect to the light emission spectrum 515 of the fluorescent layer 411. As described above, since each of the first to third fluorescent substances 413, 415, and 417 has the described area ratios, the fluorescent layer 411 has the FWHM 523 equal to or greater than 110 nm, and the peak wavelength of the yellow light from the fluorescent layer 411 exists in the wavelength range of about 530 nm to about 560 nm.

Figure 7:
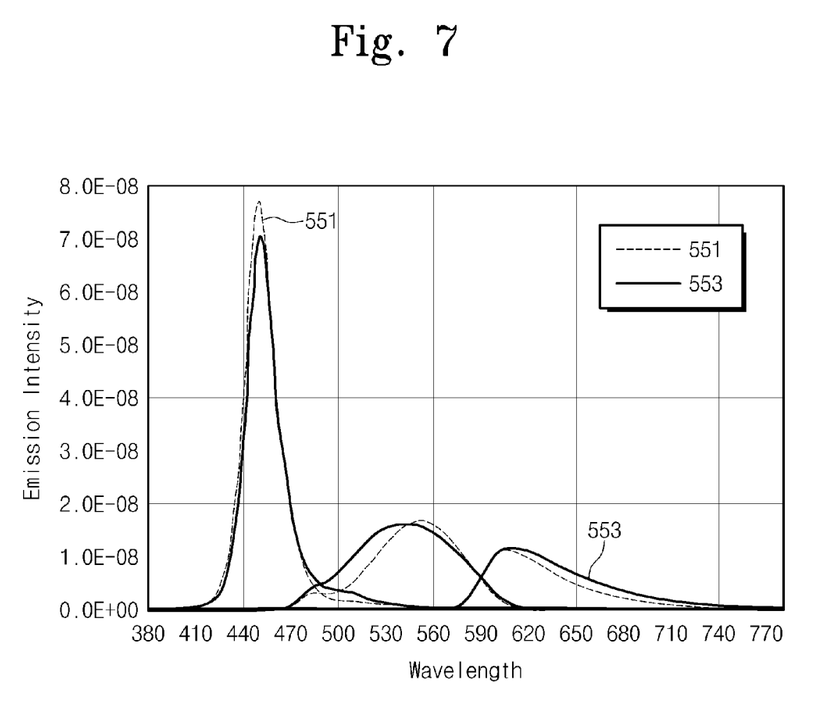
FIG. 7 is a graph showing light emission spectrums of a white light transmitted through each of red, green, and blue color filters of a display panel, after being emitted from an exemplary embodiment of a light emitting device.

FIG. 7 is a graph showing light emission spectrums of a white light transmitted through each of red, green, and blue color filters of a display panel, after being emitted from an exemplary embodiment of a light emitting device. In FIG. 7, the light emission spectra of comparative example and the light emission spectra of inventive example have been shown in order to explain the efficiency of the white light emitted from the light emitting device to which the fluorescent layer according to the invention is applied.

The comparative example 551 represents the light emission spectra obtained by transmitting the white light emitted from the light emitting device to which a conventional fluorescent layer is applied through the red, green, and blue color filters.

The inventive example 553 represents the light emission spectra obtained by transmitting the white light emitted from the light emitting device to which the fluorescent layer according to the invention is applied through the red, green, and blue color filters.

As shown in FIG. 7, the green peak wavelength of the inventive example 553 moves closer to a short-wavelength region than the green peak wavelength of the comparative example 551. In addition, according to the inventive example 553, the FWHM in the green and red wavelength regions has been increased more than that of the comparative example 551. Accordingly, the light emission spectrum of the inventive example 553 may have the area greater than the light emission spectrum of the comparative example 551 in the green and red wavelength regions, thereby improving the brightness and the color reproducibility of the display panel.

In addition, in the light emission spectrum of the fluorescent layer according to the inventive example 553, an area ratio of the green wavelength region to the red wavelength region is in the range of about 10:3 to about 7:1. The green wavelength region may be in the wavelength region of about 490 nm to about 590 nm, and the red wavelength region may be in the wavelength of about 590 nm to about 680 nm.

Figure 8:
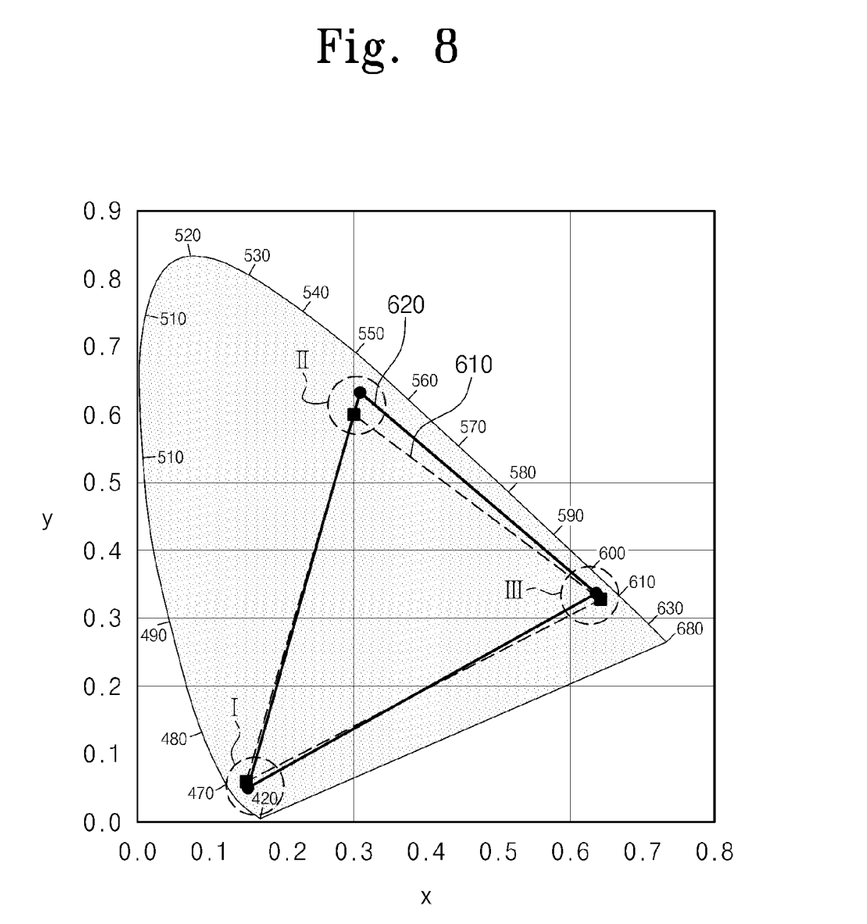
FIG. 8 is a graph showing color coordinate values of a white light transmitted through each of red, green, and blue color filter of a display panel after being emitted from an exemplary embodiment of a light emitting device.
Figure 9:
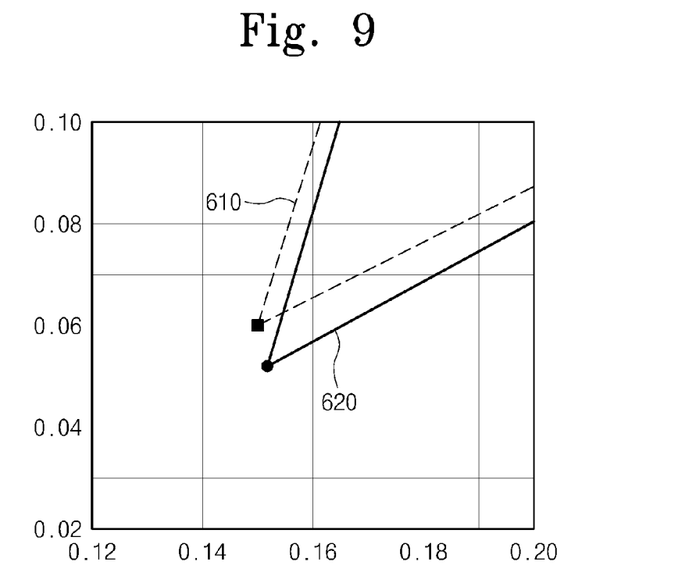
FIG. 9 is an enlarged view showing a portion of circle I of FIG. 8.
Figure 10:
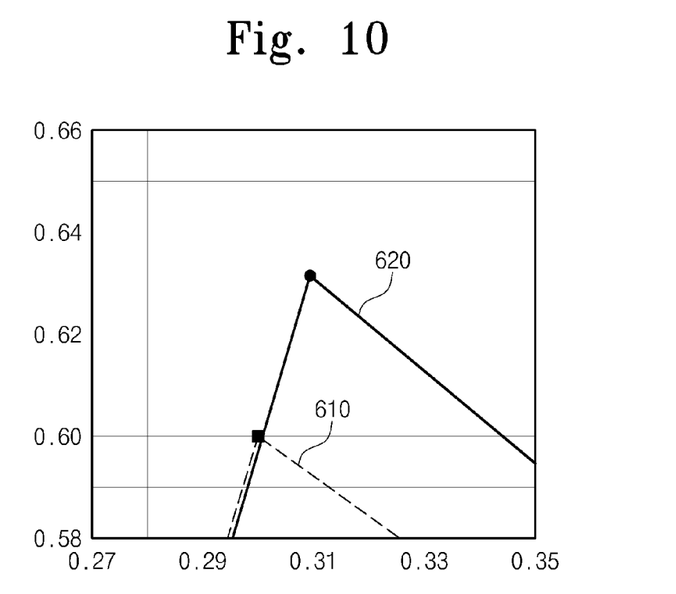
FIG. 10 is an enlarged view showing a portion of circle II of FIG. 8.
Figure 11:
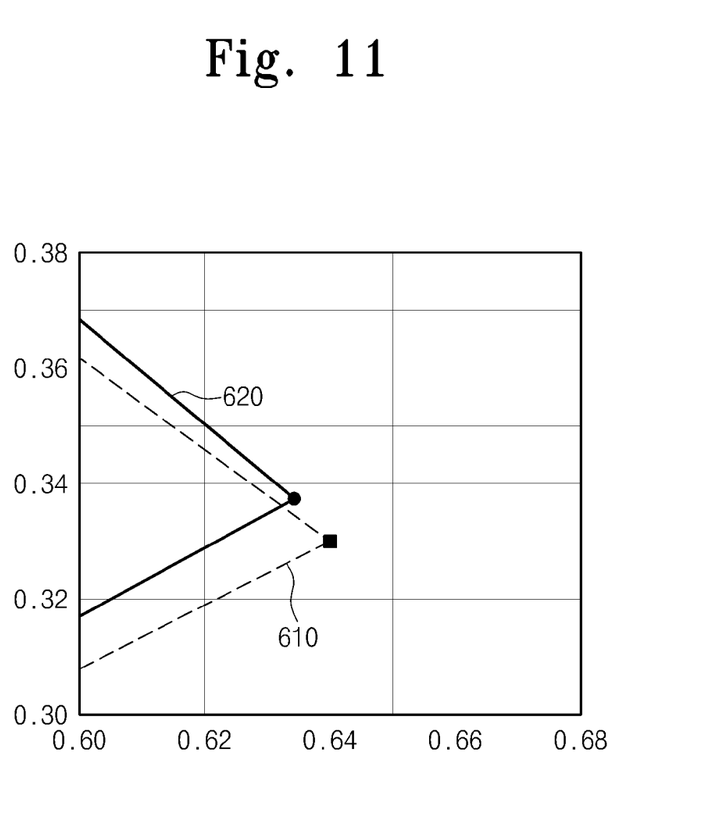
FIG. 11 is an enlarged view showing a portion of circle III of FIG. 8.

FIG. 8 is a graph showing color coordinate values of a white light transmitted through each of red, green, and blue color filter of a display panel after being emitted from an exemplary embodiment of a light emitting device. FIG. 9 is an enlarged view showing a portion of circle I of FIG. 8, FIG. 10 is an enlarged view showing a portion of circle II of FIG. 8, and FIG. 11 is an enlarged view showing a portion of circle III of FIG. 8. In FIGS. 8 to 11, the color coordinate value 620 according to the exemplary embodiment has been shown as compared with a reference color coordinate value (hereinafter, referred to as sRGB) with reference to CIE 1931 color coordinate diagram.

As shown in FIGS. 8 to 11, in the color coordinate value 620 according to the exemplary embodiment, the blue color coordinate values have been indicated as (0.1512, 0.0522), the green color coordinate values have been indicated as (0.3088, 0.6272), and the red color coordinate values have been indicated as (0.6341, 0.3363). In addition, the white color coordinate values of the color coordinate value 620 have been indicated as (0.2725, 0.2951). In the exemplary embodiment, the color coordinate value 620 has been shown to cover about 98 percent of the sRGB 610.

In addition, when brightness of the white light is measured by a measurer after transmitting through the red, green, and blue color filters, the white light according to the color coordinate value 620 of the inventive example has brightness of about 122.1 percent compared with brightness according to the color coordinate value 610 of the comparative example, and has brightness of about 74 percent in comparison with the NTSC.

Although exemplary embodiments of the invention have been described, it is understood that the invention should not be limited to these exemplary embodiments but various changes and modifications can be made by one ordinary skilled in the art within the spirit and scope of the invention as hereinafter claimed.

What is claimed is:

1. A display device comprising:
a display panel comprising a plurality of pixels; and
a light emitting device mixing a first light with a second light, to emit a third light to the display panel,
wherein the light emitting device comprises:
a light emitting element which emits the first light; and
a fluorescent layer which receives the first light, transmits a portion of the first light, converts another portion of the first light to the second light,
wherein
the second light has a full width at half maximum equal to or larger than 110 nanometers (nm) and a light emission spectrum having a peak wavelength within a wavelength range of about 530 nm to about 560 nm, and
a ratio of a light emission intensity of the second light within a predetermined wavelength range from about 500 nm to about 620 nm to a peak light emission intensity of the first light is in a range of approximately 10% to 30%.

2. The display device of claim 1, wherein a light emission spectrum of the fluorescent layer comprises a green wavelength region and a red wavelength region, and an area ratio of the green wavelength region to the red wavelength region is in the range of about 10:3 to about 7:1.

3. The display device of claim 2, wherein
the green wavelength region is in the wavelength region of about 490 nm to about 590 nm, and
the red wavelength region is in the wavelength of about 590 nm to about 680 nm.

4. The display device of claim 1, wherein the fluorescent layer comprises a silicate-based fluorescent substance comprising at least one of barium (Ba), strontium (Sr), and calcium (Ca).

5. The display device of claim 4, wherein the fluorescent layer comprises:
a first fluorescent substance having a peak wavelength within a first wavelength range of about 515 nm to about 530 nm,
a second fluorescent substance having a peak wavelength within a second wavelength range of about 540 nm to about 560 nm, and
a third fluorescent substance having a peak wavelength within a third wavelength of about 580 nm to about 610 nm.

6. The display device of claim 5, wherein
the first fluorescent substance has 20 parts by weight or less,
the second fluorescent substance has 35 to 60 parts by weight, and
the third fluorescent substance has 20 to 65 parts by weight.

7. The display device of claim 5, wherein
a light emission spectrum of the first fluorescent substance has an area smaller than 20 percent of a light emission spectrum of the fluorescent layer in the first wavelength range,
a light emission spectrum of the second fluorescent substance has an area of about 35 percent to about 60 percent with respect to the light emission spectrum of the fluorescent layer in the second wavelength range, and
a light emission spectrum of the third fluorescent substance has an area of about 20 percent to about 65 percent with respect to the light emission spectrum of the fluorescent layer in the third wavelength range.

8. The display device of claim 1, wherein the predetermined wavelength range is from about 570 nm to about 620 nm.

9. The display device of claim 8, wherein the third light has an x-axis coordinate of about 0.24 to about 0.26 and a y-axis coordinate of about 0.20 to about 0.21 with reference to a CIE 1931 color coordinate diagram.

10. The display device of claim 9, wherein
the display panel further comprises a blue color filter, a green color filter, and a red color filter, and
the blue, green and red color filters receive the third light and convert the third light to a light having an x-axis coordinate of about 0.27 to about 0.28 and a y-axis coordinate of about 0.29 to about 0.30 with reference to the CIE 1931 color coordinate diagram.

11. The display device of claim 1, wherein the first light has a light emission spectrum having a peak wavelength within a wavelength range of about 435 nm to about 460 nm.

12. A light emitting device comprising:
a light emitting element which emits a first light; and
a fluorescent layer which receives the first light, transmits a portion of the first light, converts a remaining portion of the first light to a second light having a wavelength range different from the first light, and mixes the first light with the second light to emit a third light,
wherein
a light emission spectrum of the second light from the fluorescent layer has a full width at half maximum equal to or larger than 110 nanometers (nm) and has a peak wavelength within a wavelength range of about 530 nm to about 560 nm,
the light emission spectrum of the second light from the fluorescent layer comprises a green wavelength region and a red wavelength region, and
an area ratio of the green wavelength region to the red wavelength region in the light emission spectrum is in the range of about 10:3 to about 7:1.

13. The light emitting device of claim 12, wherein
the green wavelength region is in the wavelength region of about 490 nm to about 590 nm, and
the red wavelength region is in the wavelength of about 590 nm to about 680 nm.

14. The light emitting device of claim 12, wherein the fluorescent layer comprises at least one fluorescent substance comprising a silicate-based fluorescent substance, the silicate-based fluorescent substance comprising at least one of barium (Ba), strontium(Sr), and calcium (Ca).

15. The light emitting device of claim 12, wherein the fluorescent layer comprises:
a first fluorescent substance having a peak wavelength within a first wavelength range of about 515 nm to about 530 nm,
a second fluorescent substance having a peak wavelength within a second wavelength range of about 540 nm to about 560 nm, and
a third fluorescent substance having a peak wavelength within a third wavelength of about 580 nm to about 610 nm.

16. The light emitting device of claim 15, wherein
the first fluorescent substance has 20 parts by weight or less,
the second fluorescent substance has 35 to 60 parts by weight, and
the third fluorescent substance has 20 to 65 parts by weight.

17. The light emitting device of claim 15, wherein
a light emission spectrum of the first fluorescent substance has an area smaller than 20 percent of the light emission spectrum of the fluorescent layer in the first wavelength range,
a light emission spectrum of the second fluorescent substance has an area of about 35 percent to about 60 percent with respect to the light emission spectrum of the fluorescent layer in the second wavelength range, and
a light emission spectrum of the third fluorescent substance has an area of about 20 percent to about 65 percent with respect to the light emission spectrum of the fluorescent layer in the third wavelength range.

18. The light emitting device of claim 17, wherein the third light has an x-axis coordinate of about 0.24 to about 0.26 and a y-axis coordinate of about 0.20 to about 0.21 with reference to a CIE 1931 color coordinate diagram.

19. The light emitting device of claim 12, wherein the first light has a light emission spectrum having a peak wavelength within a wavelength range of about 435 nm to about 460 nm.

* * * * *